United States Patent
He

(10) Patent No.: US 8,649,749 B2
(45) Date of Patent: Feb. 11, 2014

(54) RF RECEIVER WITH VOLTAGE SAMPLING

(71) Applicant: NXP B.V., Eindhoven (NL)

(72) Inventor: Xin He, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/651,578

(22) Filed: Oct. 15, 2012

(65) Prior Publication Data

US 2013/0109337 A1 May 2, 2013

(30) Foreign Application Priority Data

Oct. 27, 2011 (EP) .................................. 11186914

(51) Int. Cl.
*H04B 1/18* (2006.01)

(52) U.S. Cl.
USPC ........ 455/189.1; 455/256; 455/209; 455/333; 455/234.1; 455/230; 330/252; 330/261

(58) Field of Classification Search
USPC ........... 455/256, 209, 333, 189.1, 234.1, 230; 330/252, 261
See application file for complete search history.

(56) References Cited

U.S. PATENT DOCUMENTS

| | | | |
|---|---|---|---|
| 6,438,365 B1 | 8/2002 | Balteanu | |
| 7,012,457 B2 * | 3/2006 | Moran et al. | ................... 327/359 |
| 7,729,676 B2 * | 6/2010 | Bult et al. | ................... 455/234.1 |
| 8,531,325 B2 * | 9/2013 | Onody | ........................ 341/143 |
| 2007/0010230 A1 | 1/2007 | Ismail et al. | |
| 2012/0033769 A1 | 2/2012 | He | |

FOREIGN PATENT DOCUMENTS

WO    2011/097366 A2    8/2011

OTHER PUBLICATIONS

Kaczman, D. et al. "A Single-Chip 10-Band WCDMA/HSDPA 4-Band GSM/EDGE SAW-less CMOS Receiver With DigRF 3G Interface and +90 dBm IIP2", IEEE J. of Solid-State Circuits, vol. 44, No. 3, pp. 718-39 (Mar. 2009).

Andrews, C. et al. "A Passive Mixer-First Receiver With Digitally Controlled and Widely Tunable RF Interface", IEEE J. of Solid State Circuit, vol. 45, No. 12, pp. 2696-2708 (Dec. 2010).

Extended European Search Report for European Patent Appln. No. 11186914.5 (Apr. 4, 2012).

* cited by examiner

*Primary Examiner* — Sanh Phu

(57) ABSTRACT

A voltage sampling RF receiver in which an impedance control circuit controls the input impedance, by using a mixer stage which generates a feedback voltage, which is coupled to the RF input by a feedback resistor. A biasing arrangement can be used to adjust the feedback path so that local oscillator leakage signals are suppressed.

10 Claims, 4 Drawing Sheets

RF RECEIVER WITH VOLTAGE SAMPLING

CROSS-REFERENCE TO RELATED APPLICATIONS

This application claims the priority under 35 U.S.C. §119 of European patent application no. 11186914.5, filed on Oct. 27, 2011, the contents of which are incorporated by reference herein.

This invention relates to RF receivers, and in particular to RF receivers with voltage sampling input stages. The voltage sampling input stage functions as a passive mixer.

In wireless communications, one of the major challenges is that the RF receiver has to tolerate strong out-of-band interference when receiving a weak wanted signal. Usually a bulky SAW filter is often needed before the receiver to suppress the strong out-of-band interference, which increases the size and the cost of total system.

A lot of effort has already been taken to eliminate this SAW filter, for lower cost and smaller size. The most attractive solution is to use a passive mixer driven by 25%-duty cycle oscillator as the first stage, and this passive mixer avoids the need for a low noise amplifier, as shown in FIG. 1.

The circuit comprises an input stage in the form of a passive mixer, in which four local oscillator signals LO_1 to LO_4 control the coupling of the RF input to an amplifier stage by means of transistor switches, thereby to generate an Intermediate frequency ("IF") output, based on the difference between the local oscillator frequency and the RF frequency. This mixer functions as a down-conversion mixer.

The amplifier stage has two IF amplifiers. The local oscillator signals do not overlap (they have a duration of 90 degrees i.e. 25% phase duration each) and are 90 degrees out of out phase with each other.

A capacitor arrangement providing a low pass filter function is between the passive mixer and the amplifier stage.

As each switch is closed, the RF input is sampled onto a respective low pass filter capacitor. The resulting four steady state voltage levels correspond to the differential I and Q down-converted IF signals. The RC time constant (determined by the amplifier impedance and the filter capacitance) is much larger than the local oscillator period to prevent dissipation of charge.

The amplifier stage implements intermediate frequency amplification, and generates the I and Q differential signals.

In the voltage sampling receiver, the low pass filter after the mixer is transparent to RF as a high-Q RF filter, resulting in superior out-of-band linearity. The input impedance of the receiver can be approximated as:

$$Z_{in} \approx R_{SW} + \frac{2}{\pi^2} R_f / G_{IF}$$

where $R_{SW}$ is switch on-resistance, and $G_{IF}$ is the transconductance amplifier (TIA) open loop gain. Choosing proper gain and feedback resistance, the input impedance can be matched to the antenna impedance.

The known voltage sampling receiver is described in more detail in WO2011/097366.

The major issue of the voltage sampling receiver is the local oscillator leakage to the antenna. Without the isolation provided by a preceding low noise amplifier ("LNA"), the level of the local oscillator leakage to the antenna may violate regulations in many wireless applications.

The applicant has proposed (but not yet published) the use of a feedback resistor to up-convert a signal back to RF frequency and couple it back to the RF input, to enable control of impedance matching. The proposed circuit uses a transconductance amplifier at the input to the mixer (performing voltage to current conversion), and transimpedance amplifiers (performing current to voltage conversion) at the output from the mixer.

According to the invention, there is provided an RF receiver circuit comprising:

a first mixer stage comprising a first array of transistors for sampling an RF input controlled by respective local oscillator signals;

an amplifier stage for generating in-phase and quadrature output signals and comprising voltage amplifiers; and an impedance control circuit for controlling the input impedance of the receiver circuit, which comprises:

a second mixer stage comprising a second array of transistors for sampling respective input signals, and controlled by the local oscillator signals; and a feedback resistor which couples the second mixer stage output to the RF input.

The invention provides a feedback loop which provides an alternative way to implement input impedance matching, and which avoids the need for a low noise amplifier between the RF input and the first mixer stage. Instead, the RF input is coupled directly to the first mixer. The circuit also enables IF amplifiers, for example high input impedance voltage amplifiers, to be used instead of transimpedance amplifiers. This reduces the number of components needed.

Preferably, a respective DC bias voltage is coupled to each input of the second mixer stage.

By means of the DC bias voltages, the feedback loop changes the DC offset applied to the first mixer stage, and this has the effect of generating a local oscillator tone. This tone can be designed to be in anti-phase with the local oscillator leakage caused by the first (down-conversion) mixer. Therefore the overall local oscillator leakage is suppressed. The invention can be implemented as a calibration approach for suppressing the local oscillator leakage in a voltage sampling receiver.

The first mixer stage can comprise four transistors each connected to the RF input, and wherein the four local oscillator signals each have a 25% duty cycle, with the four local oscillator signals non-overlapping. Thus, the four local oscillator signals can be used to sample successive 90 degree phase segments of the RF signal.

The amplifier stage preferably comprises two differential amplifiers, with the two inputs of each differential amplifier connected to a respective two of the transistors, wherein one amplifier output comprises a differential in-phase output and the other amplifier output comprises a differential quadrature output. In this way, four signals are generated; one in-phase pair and one quadrature pair. The amplifier stage operates at an intermediate frequency (IF).

A respective low pass filter capacitor can be connected to the output of each transistor for selecting the IF signal from the spectrum.

The second mixer stage can also comprise four transistors controlled by the same four local oscillator signals.

In one implementation, with the amplifier stage generating an in-phase differential output and a quadrature differential output, the inputs to the second mixer stage comprise the four signals defined by the in-phase and quadrature differential outputs. In this way, a feedback loop is defined from the output of the amplifier stage back to the RF input of the receiver, and which effectively provides a DC voltage shift which depends on the local oscillator phase.

The inputs to the second mixer stage can also each be coupled to a respective DC bias voltage through a respective bias resistor. These DC bias voltages can be selected to vary the phase of the feedback signal. For example, the DC bias voltages can be selected to provide a DC tone at the RF input which is in anti phase with a local oscillator leakage signal.

The inputs to the second mixer stage can instead comprise four DC bias voltages. This means that an existing receiver (which does not have an internal feedback path) can be modified to provide the desired impedance matching and leakage tone suppression.

The DC bias voltages can again be selected to provide a DC tone at the RF input which is in anti phase with a local oscillator leakage signal.

Examples of the invention will now be described in detail with reference to the accompanying drawings, in which.

The invention provides a voltage sampling RF receiver in which an impedance control circuit controls the input impedance, by using a mixer stage which generates a feedback voltage, which is coupled to the RF input by a feedback resistor. In a refinement, a biasing arrangement is used to adjust the feedback path so that local oscillator leakage signals are suppressed.

Figure 2:
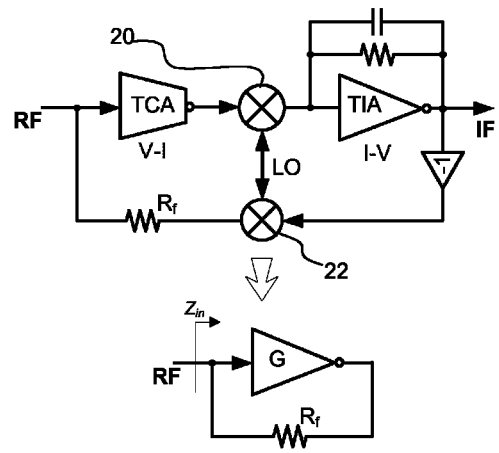
FIG. 2 shows schematically the operation principle of an input matching receiver.

FIG. 2 shows an input impedance matching receiver as proposed by the applicant.

In the receiver, first a transconductance amplifier (TCA) converts the RF input voltage to RF current. Subsequently, a passive current mixer 20 down-converts this RF current to IF current, which is then fed into a transimpedance amplifier (TIA) and converted to an IF voltage with low-pass filtering.

In addition to the receiver chain, a feedback loop is formed by up-converting the inverted IF output voltage (naturally available from the differential TIA output), using an up-converting mixer 22 and then feeding it back to the RF input via a feedback resistor Rf.

The input impedance can be approximated as $Z_{in}=R_f/G$, where G is the receiver gain in combination with the up-conversion mixer gain.

Figure 3:
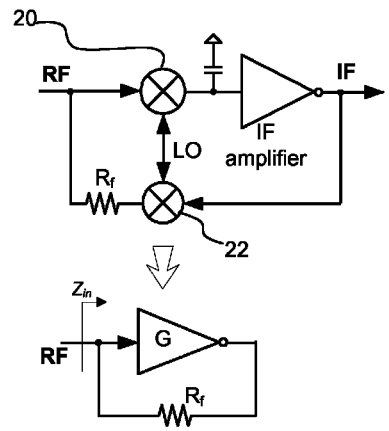
FIG. 3 shows how the operation principle explained with reference to FIG. 2 can be applied to a receiver having a voltage sampling mixer as input, in accordance with the invention.

The concept can be applied to the voltage sampling receiver, to provide a receiver of the invention as schematically illustrated in FIG. 3.

The RF voltage input directly feeds the passive mixer 20, leading to further improved out-of-band linearity. Similarly, the input impedance can be approximated as $Z_{in}=R_f/G$, where G is the receiver gain in combination with the up-conversion gain.

The intermediate frequency output of the transimpedance amplifier is again up-converted by a mixer 22 and fed back to the input via the feedback resistor Rf.

The intermediate frequency can be the centre of the desired RF signal if there is direct conversion, or it can be a lower intermediate frequency.

Figure 4:
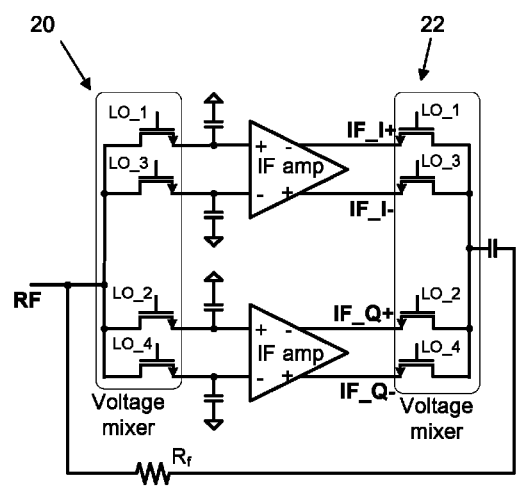
FIG. 4 shows a first example of receiver circuit of the invention.

FIG. 4 shows a circuit implementation of the voltage sampling receiver with feedback loop input matching in accordance with the invention.

Figure 1:
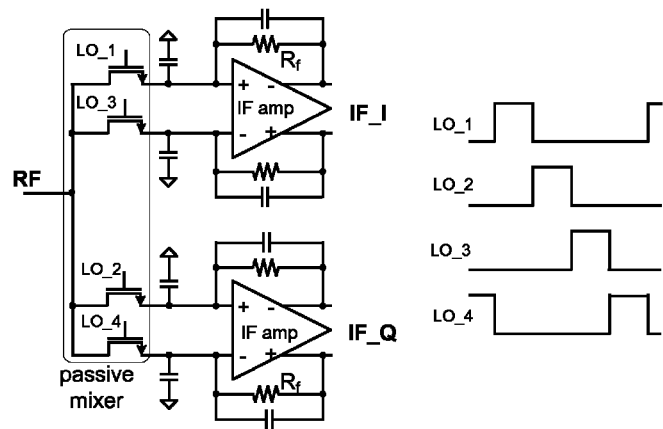
FIG. 1 shows a known receiver having a voltage sampling mixer as input stage.

The circuit corresponds to the circuit of FIG. 1, with the differential in-phase and quadrature outputs provided thought the up-converting mixer 22 to the RF input through the series feedback resistor Rf. The circuit also uses a high input impedance IF amplifier, and the signals remain in the voltage domain.

The RF input feeds a passive voltage mixer 20 driven by the 25% duty-cycle local oscillator signals, as in FIG. 1. The capacitors after the passive voltage mixer 20 provide a first order filtering.

The mixer IF outputs are amplified by the IF amplifiers. The feedback loop is formed by up-converting the IF voltage output and feeding back to the RF input.

To reduce current, a passive voltage mixer driven by 25% duty-cycle local oscillators is employed as the up-conversion mixer 22. An AC coupling capacitor is also provided in the feedback loop.

This arrangement provides input impedance matching, and avoids the need for a low noise amplifier or transconductance amplifier.

This circuit does not resolve the issue of local oscillator leakage. A refinement to the invention also resolves this issue, if needed.

In order to alleviate the local oscillator leakage generated by the down-conversion mixer 20, a calibration method can be used.

Figure 5:
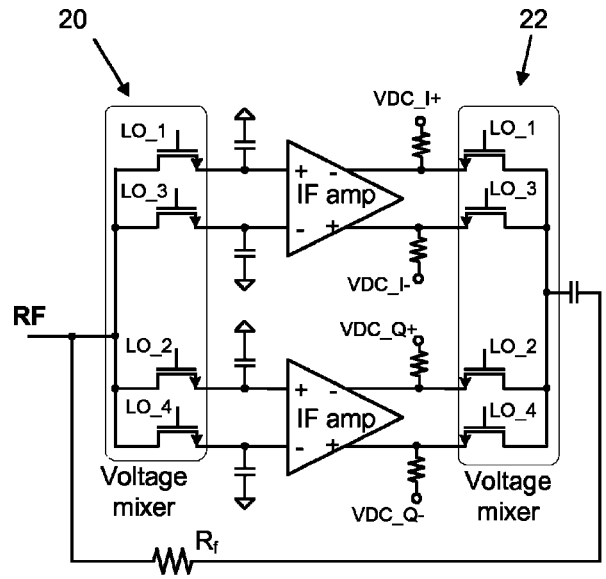
FIG. 5 shows a second example of receiver circuit of the invention.

As shown in FIG. 5, four DC voltages VDC_I+, VDC_I−, VDC_Q+ and VDC_Q− feed the up-conversion mixer 22 and yield a local oscillator tone at the RF input. The phase of the local oscillator tone can be tuned to be in anti-phase with the local oscillator leakage, by varying the DC offset.

Figure 6:
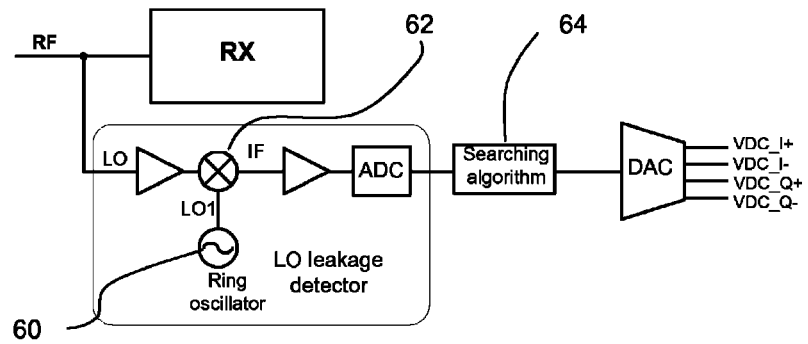
FIG. 6 shows how a calibration of offset voltages used in the circuit of FIG. 5 can be carried out.

The calibration method is explained with reference to FIG. 6.

By using a ring oscillator 60, a test tone LO1 with frequency close to the local oscillator frequency (signal LO) is generated. An extra mixer 62 is employed to down-convert the local oscillator leakage to IF.

The local oscillator leakage signal is provided to the circuit from the mixer 20 via the RF input port. However, at the time of the calibration, the antenna is switched off, so that only the local oscillator leakage signal is provided to the calibration circuit.

The calibration circuit is used to control the receiver circuit by means of the bias voltages so that a feedback loop is defined. In this way, the feedback loop obtains the local oscillator leakage information, and this feeds a searching algorithm 64 to tune the DC offsets and find the lowest local oscillator leakage level. When the calibration is done, the local oscillator leakage detector and the searching algorithm can be turned off.

The calibration can be performed each time the receiver is used, so that the calibration can be performed for the particular frequency of operation.

Figure 7:
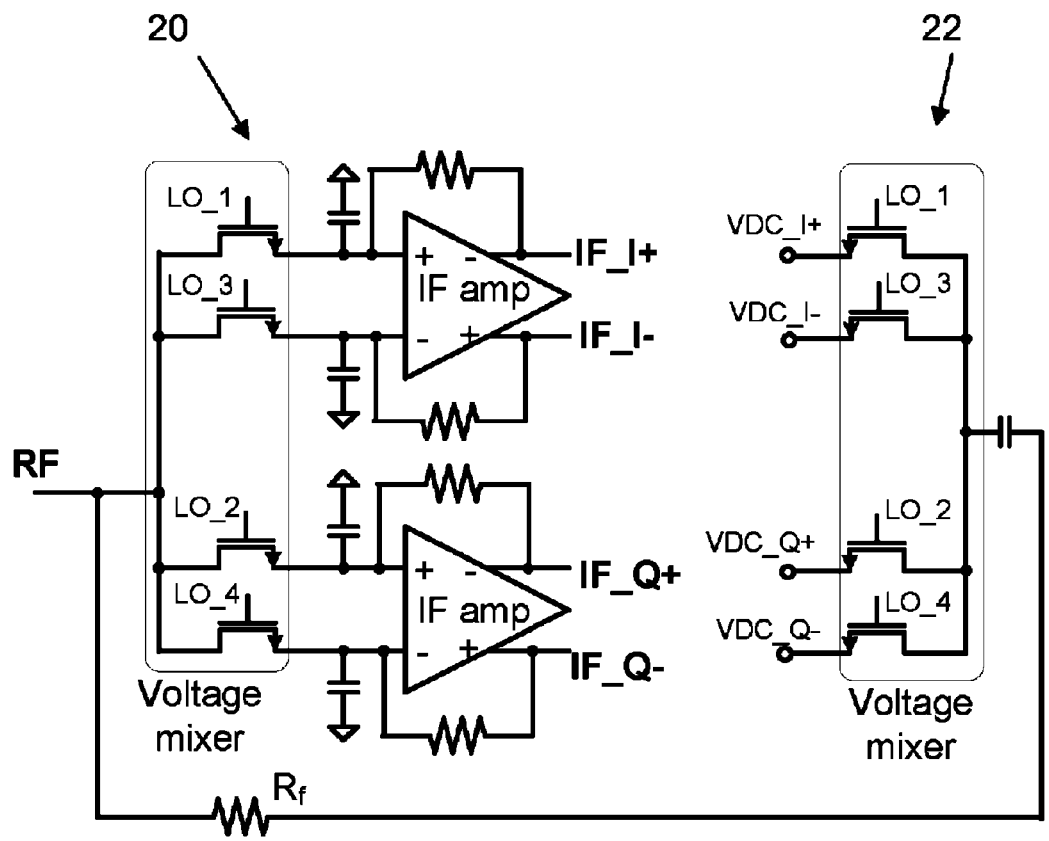
FIG. 7 shows a second example of receiver circuit of the invention.

The calibration method can be also applied to a conventional voltage sampling receiver by opening the feedback loop, as shown in FIG. 7.

In this case, the DC bias voltages are supplied directly to the inputs of the second mixer, and couple a local oscillator tone with desired phase back to the RF input. The Rf feedback mechanism can then be implemented as additional components external to an existing receiver, provided between the output and input, and without requiring access to any intermediate nodes in the receiver circuit.

The invention can be applied to a receiver for any wireless applications, such as cellular, connectivity, hearing aid radio, and car access radio.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An RF receiver circuit comprising:
   a first mixer stage comprising a first array of transistors for sampling an RF input controlled by respective local oscillator signals;
   an amplifier stage for generating in-phase and quadrature output signals, and comprising a plurality of voltage amplifiers; and
   an impedance control circuit for controlling the input impedance of the receiver circuit, which comprises:
   a second mixer stage comprising a second array of transistors for sampling respective input signals, having an output, and which is controlled by the local oscillator signals; and
   a feedback resistor which couples the second mixer stage output to the RF input.

2. A circuit as claimed in claim 1, wherein the first mixer stage comprises four transistors each connected to the RF input, and wherein the four local oscillator signals each have a 25% duty cycle, with the four local oscillator signals non-overlapping.

3. A circuit as claimed in claim 2, wherein the amplifier stage comprises two high input impedance differential voltage amplifiers, with the two inputs of each differential amplifier connected to a respective two of the transistors, wherein one amplifier output comprises a differential in-phase output and the other amplifier output comprises a differential quadrature output.

4. A circuit as claimed in claim 3, further comprising a respective low pass filter capacitor connected to the output of each transistor.

5. A circuit as claimed in any preceding claim 1, wherein the amplifier stage generates an in-phase differential output and a quadrature differential output, and wherein the inputs to the second mixer stage comprise the four signals defined by the in-phase and quadrature differential outputs.

6. A circuit as claimed in claim 1, wherein the second mixer stage comprises four transistors controlled by the four local oscillator signals.

7. A circuit as claimed in claim 1, wherein a respective DC bias voltage is coupled to each input of the second mixer stage.

8. A circuit as claimed in claim 7, wherein the DC bias voltages are selected to provide a DC tone at the RF input which is in anti phase with a leakage signal present in the local oscillator signals.

9. A circuit as claimed in claim 7, wherein the inputs to the second mixer stage are each coupled to a respective one of said DC bias voltages through a respective bias resistor.

10. A circuit as claimed in claim 7, wherein the inputs to the second mixer stage comprise said DC bias voltages.

* * * * *